(12) United States Patent
Dejima et al.

(10) Patent No.: US 9,117,864 B2
(45) Date of Patent: Aug. 25, 2015

(54) ASSEMBLIES OF STACKED CASSETTES

(71) Applicant: Disco Corporation, Tokyo (JP)

(72) Inventors: Nobukazu Dejima, Tokyo (JP); Masaya Takeuchi, Tokyo (JP); Seiki Ohishi, Tokyo (JP); Yuji Okimoto, Tokyo (JP); Naoya Tokumitsu, Tokyo (JP); Takeshi Komaba, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 14/168,217

(22) Filed: Jan. 30, 2014

(65) Prior Publication Data

US 2014/0231305 A1    Aug. 21, 2014

(30) Foreign Application Priority Data

Feb. 18, 2013    (JP) ................................. 2013-028958

(51) Int. Cl.
*A47G 19/08*    (2006.01)
*H01L 21/673*    (2006.01)

(52) U.S. Cl.
CPC .................................. *H01L 21/6732* (2013.01)

(58) Field of Classification Search
CPC ... H01L 21/68; H01L 21/6732; H01L 21/673; H01L 21/67309; H01L 21/67326; H01L 67/303; H01L 67/34; B65D 85/00; B65D 85/48; B65D 85/86; A47B 87/005; A47B 87/007; A47B 87/02; A47B 87/0207; A47B 87/0253; A47B 87/0261; A47B 87/0276; A47B 87/0292; A47B 87/0284; A47B 57/44
USPC ..................... 211/41.12, 40, 41.18, 188, 194; 206/710, 711, 454, 832, 833; 414/935–941
See application file for complete search history.

(56) References Cited

U.S. PATENT DOCUMENTS

| | | | | |
|---|---|---|---|---|
| 3,052,821 A | * | 9/1962 | Scoville | 174/535 |
| 3,446,544 A | * | 5/1969 | Serwer | 312/111 |
| 4,153,164 A | * | 5/1979 | Hofmeister et al. | 211/41.18 |
| 4,277,120 A | * | 7/1981 | Drake et al. | 312/223.1 |
| 4,434,899 A | * | 3/1984 | Rivkin | 211/41.17 |
| 4,600,231 A | * | 7/1986 | Sickles | 294/161 |
| 4,779,732 A | * | 10/1988 | Boehm et al. | 206/454 |
| 5,611,448 A | * | 3/1997 | Chen | 220/4.27 |
| 5,638,958 A | * | 6/1997 | Sanchez | 206/710 |
| 5,971,826 A | * | 10/1999 | Delzompo et al. | 446/75 |
| 6,834,920 B2 | * | 12/2004 | Landsberger et al. | 312/257.1 |

(Continued)

FOREIGN PATENT DOCUMENTS

JP    2000-091411    3/2000

*Primary Examiner* — Jennifer E Novosad
(74) *Attorney, Agent, or Firm* — Greer Burns & Crain Ltd.

(57) ABSTRACT

A cassette assembly for storing a plurality of platelike workpieces. The cassette assembly includes a first cassette, a second cassette stacked on the first cassette, and a fixing unit for fixing the first cassette and the second cassette to each other in the stacked condition. Both of the cassettes include a first side plate having workpiece supporting grooves, and a second side plate arranged parallel to the first side plate. The second side plate has workpiece supporting grooves respectively opposed to the workpiece supporting grooves of the first side plate, a top plate for connecting the upper ends of the first and second side plates, a bottom plate for connecting the lower ends of the first and second side plates, and a load/unload opening formed near the front ends of the first and second side plates, the top plate, and the bottom plate for loading and unloading the workpieces.

2 Claims, 6 Drawing Sheets

(56) References Cited

U.S. PATENT DOCUMENTS

| | | | |
|---|---|---|---|
| 7,299,927 B2* | 11/2007 | Emter et al. | 206/710 |
| 7,500,564 B2* | 3/2009 | Choi | 206/711 |
| 7,857,139 B2* | 12/2010 | Contes | 206/710 |
| 8,528,750 B2* | 9/2013 | Heo | 211/41.18 |
| 2001/0042726 A1* | 11/2001 | Chiu et al. | 211/41.18 |
| 2002/0063100 A1* | 5/2002 | Kwang | 211/40 |
| 2003/0066810 A1* | 4/2003 | Chu | 211/41.18 |
| 2004/0222126 A1* | 11/2004 | Chen et al. | 206/710 |
| 2006/0049075 A1* | 3/2006 | Chen | 206/504 |
| 2007/0062889 A1* | 3/2007 | Salzmann | 211/41.18 |
| 2011/0100937 A1* | 5/2011 | Mohamed | 211/41.18 |
| 2011/0259839 A1* | 10/2011 | Kosenko | 211/40 |
| 2013/0341239 A1* | 12/2013 | Inoue | 206/711 |
| 2014/0231305 A1* | 8/2014 | Dejima et al. | 206/711 |

* cited by examiner

ASSEMBLIES OF STACKED CASSETTES

BACKGROUND OF THE INVENTION

1. Field of the Invention

The present invention relates to a cassette assembly for storing a plurality of wafer units including semiconductor wafers, for example.

2. Description of the Related Art

In a semiconductor device fabrication process, a plurality of crossing division lines called streets are formed on the front side of a substantially disk-shaped semiconductor wafer to thereby partition a plurality of regions where a plurality of semiconductor devices such as ICs and LSIs are respectively formed. The semiconductor wafer is cut along the streets by a processing apparatus such as a cutting apparatus and a laser processing apparatus to thereby obtain the individual semiconductor devices.

The processing apparatus mentioned above includes workpiece holding means for holding a wafer unit formed by attaching a wafer to a dicing tape supported to an annular frame, processing means for processing the wafer of the wafer unit held by the workpiece holding means, feeding means for relatively moving the workpiece holding means and the processing means in a feeding direction, a cassette table for mounting a cassette storing a plurality of wafer units, and transfer means for transferring the wafer units stored in the cassette mounted on the cassette table to the workpiece holding means.

The cassette for storing a plurality of wafer units includes a first side wall and a second side wall arranged parallel to the first side wall with a predetermined space defined therebetween. A plurality of frame supporting grooves are formed on the inner surface of each of the first and second side walls in such a manner that the frame supporting grooves of the first side wall are respectively opposed to the frame supporting grooves of the second side wall. The opposite side portions of the annular frame constituting each wafer unit is inserted into any opposed ones of the frame supporting grooves of the first and second side walls and placed on the lower surfaces of the opposed frame supporting grooves, thereby storing each wafer unit in the cassette. The cassette as configured above has a capacity of storing about 25 wafer units in consideration of the operating efficiency of the processing apparatus (see Japanese Patent Laid-open No. 2000-91411, for example).

SUMMARY OF THE INVENTION

However, even in the case of processing small-lot multikind wafers, several wafers are stored in the conventional cassette having a capacity of storing about 25 wafers, and this cassette storing the several wafers is set in a processing apparatus such as a cutting apparatus and a laser processing apparatus, causing a problem such that there is waste in space of the cassette and the cassette may unnecessarily occupy a location area.

Further, in the case of performing step A to process different kinds of wafers, next performing step B to process other different kinds of wafers, and next performing step C to process the wafers according to the different kinds, the small-lot multikind wafers are stored in a plurality of cassettes according to the different kinds, and these plural cassettes are separately carried to each step. As a result, there is another problem that the productivity is reduced.

It is therefore an object of the present invention to provide a cassette assembly configured by stacking a plurality of cassettes which can be suitably combined according to small-lot multikind workpieces.

In accordance with an aspect of the present invention, there is provided a cassette assembly for storing a plurality of platelike workpieces, including a first cassette; a second cassette stacked on the first cassette; and fixing means for fixing the first cassette and the second cassette to each other in the stacked condition of the first and second cassettes. Each of the first and second cassettes includes: a first side plate having a plurality of workpiece supporting grooves; a second side plate arranged parallel to the first side plate with a predetermined space defined therebetween, the second side plate having a plurality of workpiece supporting grooves respectively opposed to the workpiece supporting grooves of the first side plate; a top plate for connecting the upper ends of the first and second side plates; a bottom plate for connecting the lower ends of the first and second side plates; and a load/unload opening formed near the front ends of the first and second side plates, the top plate, and the bottom plate for loading and unloading the workpieces.

Preferably, a positioning projection is provided on the upper end of each of the first and second side plates, and a positioning recess corresponding to the positioning projection is provided on the lower end of each of the first and second side plates.

Preferably, the fixing means includes a catch member provided on the lower portion of the outer surface of each of the first and second side plates of the second cassette; and an engaging member provided on the upper portion of the outer surface of each of the first and second side plates of the first cassette for engaging the catch member provided on each of the first and second side plates of the second cassette in the stacked condition of the first and second cassettes.

Preferably, the fixing means includes a female screw formed on the central portion of the outer surface of each of the first and second side plates of each cassette; a tightening member having a male screw for threadedly engaging the female screw; and a connecting bracket having a plurality of cutouts for respectively receiving the male screws threadedly engaged with the female screws of the first and second side plates in the stacked condition of the first and second cassettes.

Preferably, the fixing means includes a female screw block mounted on the lower portion of the outer surface of each of the first and second side plates of the second cassette, the female screw block having a female screw; a connecting block mounted on the upper portion of the outer surface of each of the first and second side plates of the first cassette at a position adjacent to the female screw block mounted on each of the first and second side plates of the second cassette in the stacked condition of the first and second cassettes, the connecting block having a bolt insert hole corresponding to the female screw of the female screw block; and a fastening bolt adapted to be inserted through the bolt insert hole of the connecting block and threadedly engaged with the female screw of the female screw block.

In the case of processing small-lot multikind wafers according to the present invention, the first cassette or the second cassette may be used to eliminate waste in space of a cassette assembly, thereby solving the problem that the cassette assembly may unnecessarily occupy a location area. In the case of performing step A to process different kinds of wafers, the plural cassettes are stacked and fixed to each other by the fixing means to form the cassette assembly. In the case of performing step B subsequent to step A to process the wafers, the cassette assembly is disassembled to restore the individual cassettes. Thereafter, another cassette containing another kind of wafers is stacked to form the cassette assembly, which is subjected to step B. In the case of performing step C subsequent to step B to process the wafers, the cassette assembly is disassembled to restore the individual cassettes, which are subjected to step C and different processes are performed according to the different kinds of wafers. Accordingly, even when the wafers to be processed are small-lot multikind wafers, the plural cassettes containing the wafers different in kind can be stacked and fixed to each other by the fixing means to form the cassette assembly, which is then carried to each step. As a result, the productivity can be improved.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
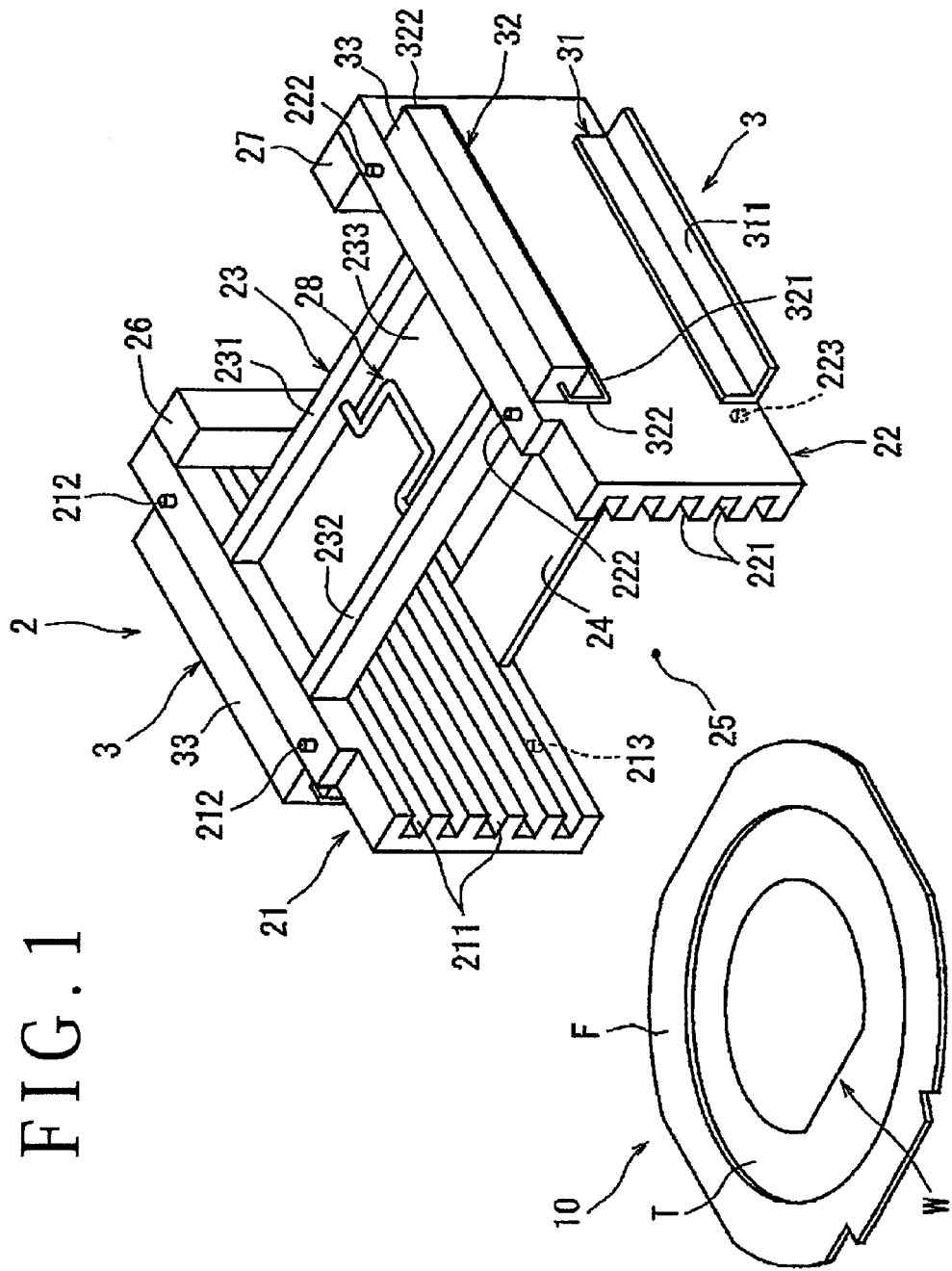
FIG. 1 is a perspective view of a cassette according to a preferred embodiment of the present invention.

A preferred embodiment of the cassette assembly according to the present invention will now be described in detail with reference to the attached drawings. FIG. 1 is a perspective view showing a wafer unit 10 formed by attaching a wafer W to a dicing tape T supported to an annular frame F and also showing a cassette 2 for storing a plurality of such wafer units 10, the cassette 2 constituting the cassette assembly according to the present invention. The cassette 2 includes a first side plate 21, a second side plate 22 arranged parallel to the first side plate 21 with a predetermined space defined therebetween, a top plate 23 for connecting the upper ends of the first and second side plates 21 and 22, and a bottom plate 24 for connecting the lower ends of the first and second side plates 21 and 22. A load/unload opening 25 for loading and unloading the wafer units 10 is formed near the front ends of the first and second side plates 21 and 22, the top plate 23, and the bottom plate 24. Two stoppers 26 and 27 for preventing the wafer units 10 from falling down are mounted on the inner surfaces of the first and second side plates 21 and 22 near the rear ends thereof. The cassette 2 configured above is formed of aluminum alloy.

The first and second side plates 21 and 22 are rectangular in shape. A plurality of workpiece supporting grooves 211 for receiving side portions of the wafer units 10 are formed on the inner surface of the first side plate 21 so as to extend in parallel in the longitudinal direction of the cassette 2. Similarly, a plurality of workpiece supporting grooves 221 for receiving opposite side portions of the wafer units 10 are formed on the inner surface of the second side plate 22 so as to extend in parallel in the longitudinal direction of the cassette 2. The plural workpiece supporting grooves 211 of the first side plate 21 are opposed to the plural workpiece supporting grooves 221 of the second side plate 22, respectively. For example, five workpiece supporting grooves 211 and five workpiece supporting grooves 221 are formed like shelves in this preferred embodiment. The workpiece in the present invention is not limited to the wafer W and the wafer units 10, but may include any general platelike workpiece.

The top plate 23 for connecting the upper ends of the first and second side plates 21 and 22 is composed of two connecting bars 231 and 232 spaced from each other and a connecting plate 233 for connecting the lower surfaces of the two connecting bars 231 and 232. Both ends of the top plate 23 are connected to the inner surfaces of the first and second side plates 21 and 22. A handle member 28 adapted to be grasped in carrying the cassette 2 is mounted on the top plate 23. The handle member 28 has a cranklike shape and it is pivotably supported at its opposite end portions to the two connecting bars 231 and 232. Accordingly, the handle member 28 can be laid to be accommodated in the space between the two connecting bars 231 and 232 as shown in FIG. 1. The bottom plate 24 for connecting the lower ends of the first and second side plates 21 and 22 is formed as a beltlike member connecting the longitudinally central portions of the first and second side plates 21 and 22. The bottom plate 24 may be formed as connecting bars.

The cassette 2 is configured so that a plurality of cassettes 2 can be stacked. More specifically, two positioning pins 212 as positioning projections are provided on the upper end of the first side plate 21 constituting the cassette 2. Similarly, two positioning pins 222 as positioning projections are provided on the upper end of the second side plate 22 constituting the cassette 2. On the other hand, two positioning holes 213 (one of which being shown in FIG. 1) as positioning recesses are provided on the lower end of the first side plate 21 so as to be respectively correspond to the two positioning pins 212. Similarly, two positioning holes 223 (one of which being shown in FIG. 1) as positioning recesses are provided on the lower end of the second side plate 22 so as to respectively correspond to the two positioning pins 222. Accordingly, by engaging the positioning pins 212 and 222 provided on the upper ends of the first and second side plates 21 and 22 of the cassette 2 with the positioning holes 213 and 223 provided on the lower ends of the first and second plates 21 and 22 of another cassette 2, the two cassettes 2 can be stacked in a predetermined condition.

Each cassette 2 is provided with fixing means 3 for fixing the plural cassettes 2 in their stacked condition. The fixing means 3 is provided on the outer surface of each of the first and second side plates 21 and 22. The fixing means 3 is composed of a catch member 31 provided on the lower portion of the outer surface of each of the first and second side plates 21 and 22 and an engaging member 32 provided on the upper portion of the outer surface of each of the first and second side plates 21 and 22 for releasably engaging the catch member 31 provided on the outer surface of each of the first and second side plates 21 and 22 of the upper cassette 2 in the condition where the plural cassettes 2 are stacked. The catch member 31 is a sectionally L-shaped member and it has a catch portion 311 projecting laterally outward.

The engaging member 32 of each fixing means 3 is composed of an engaging portion 321 for engaging the catch portion 311 of the catch member 31 and two supporting portions 322 extending from both ends of the engaging portion 321 and bent so as to form an L shape. A mounting member 33 is provided on the upper portion of the outer surface of each of the first and second side plates 21 and 22. The two supporting portions 322 of the engaging member 32 are pivotably supported to both ends of the mounting member 33. Accordingly, the engaging member 32 is mounted to the mounting member 33 so that the engaging portion 321 is rotatable about the supporting portions 322. In this preferred embodiment, the engaging member 32 of each fixing means 3 can be used also as handle means.

Figure 2:
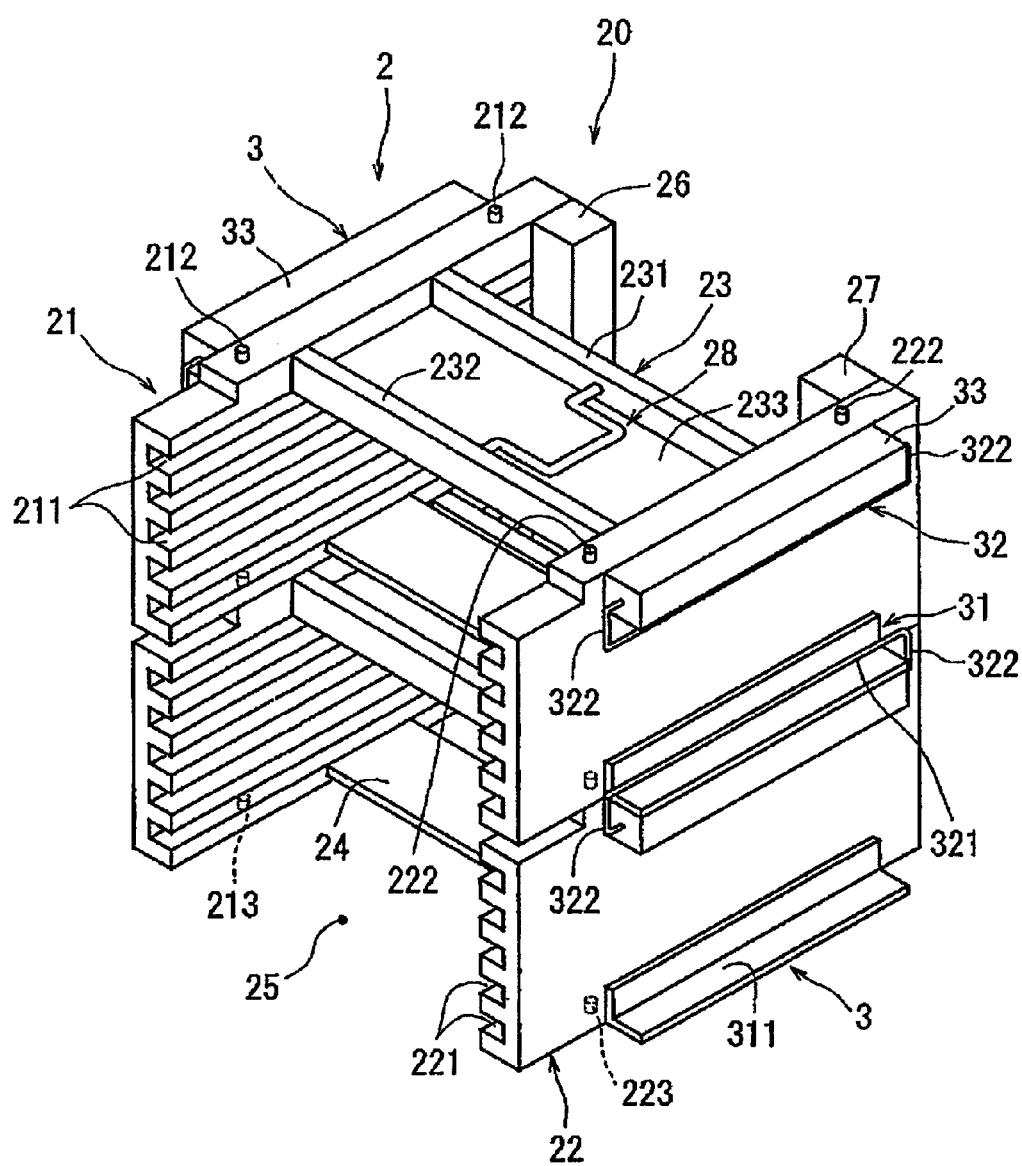
FIG. 2 is a perspective view of a cassette assembly configured by stacking two cassettes each of which is shown in FIG. 1 and fixing these cassettes by fixing means.

Each cassette 2 in this preferred embodiment is configured above, and the plural cassettes 2 are stacked to configure a cassette assembly 20 shown in FIG. 2. This cassette assembly 20 will now be described with reference to FIG. 2. The cassette assembly 20 shown in FIG. 2 is configured by stacking the two cassettes 2. In stacking the two cassettes 2, the positioning holes 213 and 223 provided on the lower ends of the first and second side plates 21 and 22 of the upper cassette 2 are engaged with the positioning pins 212 and 222 provided on the upper ends of the first and second side plates 21 and 22 of the lower cassette 2. Thereafter, the engaging members 32 of the fixing means 3 provided on the first and second side plates 21 and 22 of the lower cassette 2 are rotated upward about the respective supporting portions 322 to bring the respective engaging portions 321 into engagement with the catch portions 311 of the catch members 31 provided on the first and second side plates 21 and 22 of the upper cassette 2. As a result, the two cassettes 2 stacked are fixed to each other by the respective fixing means 3.

The plural wafer units 10 having the wafers W are stored into the lower cassette 2 and the upper cassette 2 of the cassette assembly 20, wherein the wafers W stored in the lower cassette 2 are different in kind from the wafers W stored in the upper cassette 2. The cassette assembly 20 thus obtained by connecting the lower cassette 2 and the upper cassette 2 can be carried by grasping the handle member 28 mounted on the top plate 23 of the upper cassette 2. In the case that five cassettes 2 are stacked to configure the cassette assembly 20, the cassette assembly 20 can store substantially the same number of wafers as that of wafers to be stored in a conventional cassette assembly.

As described above, the cassette assembly 20 according to the present invention is configured by stacking the plural cassettes 2. Accordingly, in the case of processing small-lot multikind wafers, the plural cassettes 2 may be separately used to eliminate waste in space of a cassette assembly, thereby solving the problem that the cassette assembly may unnecessarily occupy a location area. In the case of performing step A to process different kinds of wafers, the plural cassettes 2 are stacked and fixed to each other by the fixing means 3 to form the cassette assembly 20. In the case of performing step B subsequent to step A to process the wafers, the cassette assembly 20 is disassembled to restore the individual cassettes 2. Thereafter, another cassette 2 containing another kind of wafers is stacked and fixed by the fixing means 3 to form the cassette assembly 20, which is subjected to step B. In the case of performing step C subsequent to step B to process the wafers, the cassette assembly 20 is disassembled to restore the individual cassettes 2, which are subjected to step C and different processes are performed according to the different kinds of wafers. Accordingly, even when the wafers to be processed are small-lot multikind wafers, the plural cassettes 2 containing the wafers different in kind can be stacked and fixed to each other by the fixing means 3 to form the cassette assembly 20, which is then carried to each step. As a result, the productivity can be improved.

Figure 3:
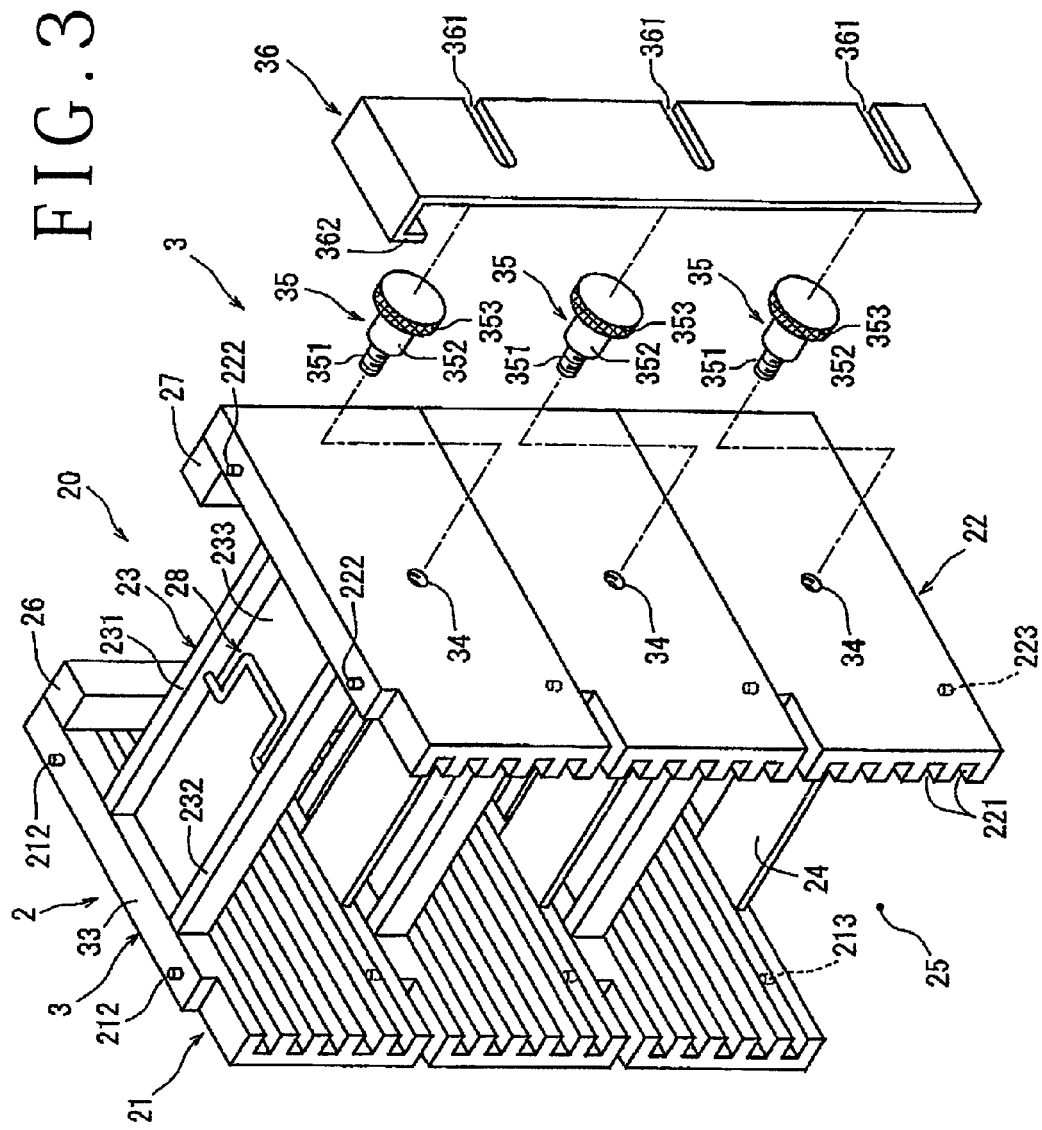
FIG. 3 is an exploded perspective view showing another preferred embodiment of the fixing means.
Figure 4:
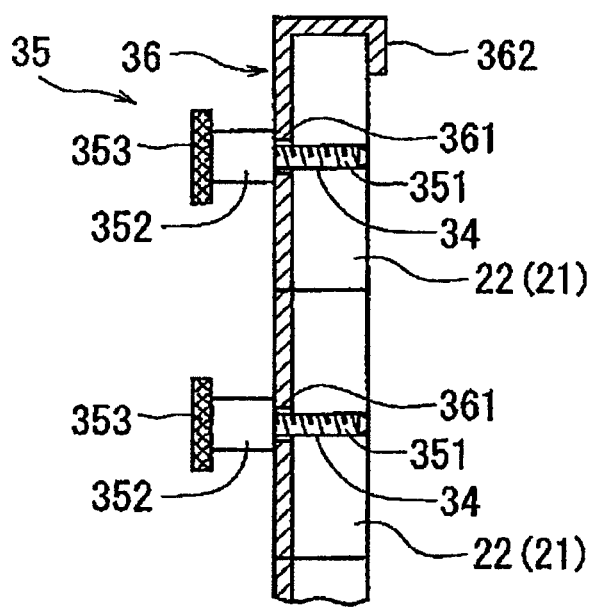
FIG. 4 is a sectional view of an essential part showing a fixed condition by the fixing means shown in FIG. 3.

There will now be described another preferred embodiment of the fixing means 3 for fixing the cassettes 2 in their stacked condition with reference to FIGS. 3 and 4. The fixing means 3 shown in FIGS. 3 and 4 is composed of a female screw 34 formed on the central portion of the outer surface of each of the first and second side plates 21 and 22 of each cassette 2, a tightening member 35 having a male screw 351 for threadedly engaging the female screw 34, and a connecting bracket 36 having a plurality of cutouts 361 for respectively receiving the male screws 351 threadedly engaged with the female screws 34 of the first and second side plates 21 and 22 in the stacked condition of the plural cassettes 2. Each tightening member 35 is composed of the male screw 351 forming a front portion to be threadedly engaged with the female screw 34, a tightening portion 352 connected to the male screw 351 and having a diameter larger than that of the male screw 351, and an operating portion 353 connected to the tightening portion 352 and having a knurled periphery and a diameter larger than that of the tightening portion 352. The connecting bracket 36 is formed from a thin plate member and it has the plural cutouts 361 for respectively receiving the male screws 351 threadedly engaged with the female screws 34 of the first and second side plates 21 and 22 in the stacked condition of the plural cassettes 2. Each cutout 361 has a width slightly larger than the diameter of the male screw 351 constituting each tightening member 35 and smaller than the diameter of the tightening portion 352 constituting each tightening member 35. The connecting bracket 36 has a hook portion 362 for engaging the upper end portion of each of the first and second side plates 21 and 22 constituting the uppermost one of the plural cassettes 2 in their stacked condition. The hook portion 362 is formed by bending the upper end portion of the connecting bracket 36.

The operation of the fixing means 3 shown in FIGS. 3 and 4 will now be described. As shown in FIG. 4, the hook portion 362 of the connecting bracket 36 is engaged with the upper end portion of each of the first and second side plates 21 and 22 of the uppermost one of the plural cassettes 2 in their stacked condition. In this condition, the male screw 351 of each tightening member 35 is threadedly engaged with the female screw 34 formed in each of the first and second side plates 21 and 22. Thereafter, the cutouts 361 of the connecting bracket 36 respectively receive the male screws 351 of the tightening members 35. Thereafter, the operating portion 353 of each tightening member 35 is rotated to tighten the male screw 351 of each tightening member 35, thereby firmly sandwiching the connecting bracket 36 between the tightening portion 352 of each tightening member 35 and the outer surface of each of the first and second side plates 21 and 22. As a result, the plural cassettes 2 in the stacked condition are fixed to each other by the fixing means 3 to form the cassette assembly 20 shown in FIG. 3.

Figure 5:
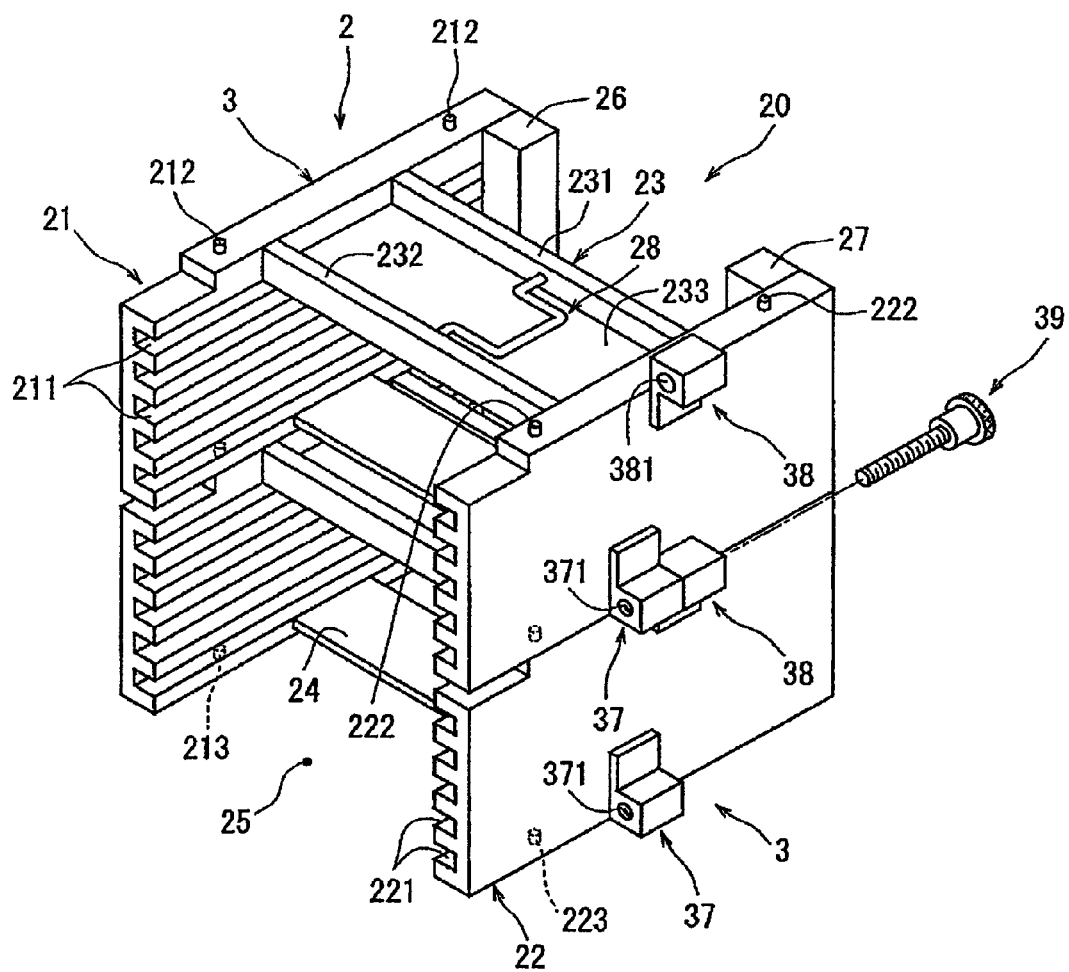
FIG. 5 is an exploded perspective view showing a further preferred embodiment of the fixing means.
Figure 6:
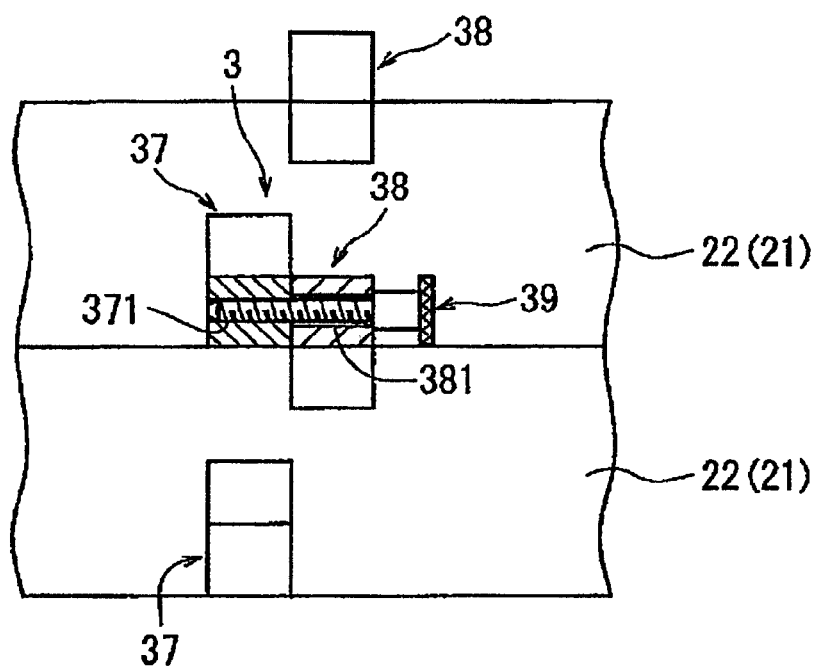
FIG. 6 is a sectional view of an essential part showing a fixed condition by the fixing means shown in FIG. 5.

There will now be described a further preferred embodiment of the fixing means 3 for fixing the cassettes 2 in their stacked condition with reference to FIGS. 5 and 6. The fixing means 3 shown in FIGS. 5 and 6 is composed of a female screw block 37 mounted on the lower portion of the outer surface of each of the first and second side plates 21 and 22 of each cassette 2, a connecting block 38 mounted on the upper portion of the outer surface of each of the first and second side plates 21 and 22 of each cassette 2, and a fastening bolt 39 for fastening the female screw block 37 mounted on each of the first and second side plates 21 and 22 of the upper cassette 2 to the connecting block 38 mounted on each of the first and second side plates 21 and 22 of the lower cassette 2 in the stacked condition of the plural cassettes 2. The female screw block 37 is formed with a female screw 371 extending in the longitudinal direction of each cassette 2.

The connecting block 38 is mounted on each of the first and second side plates 21 and 22 of the lower cassette 2 at a position adjacent to the female screw block 37 mounted on each of the first and second side plates 21 and 22 of the upper cassette 2 in the stacked condition of the plural cassettes 2. The connecting block 38 is formed with a bolt insert hole 381 extending in the longitudinal direction of each cassette 2, wherein the bolt insert hole 381 is aligned with the female screw 371 of the female screw block 37 in the stacked condition of the plural cassettes 2. The operation of the fixing means 3 shown in FIGS. 5 and 6 will now be described. In the stacked condition of the plural cassettes 2 as shown in FIG. 6, the fastening bolt 39 is inserted through the bolt insert hole 381 of the connecting block 38 mounted on each of the first and second side plates 21 and 22 of the lower cassette 2, and then threadedly engaged with the female screw 371 of the female screw block 37 mounted on each of the first and second side plates 21 and 22 of the upper cassette 2, thereby firmly connecting the female screw block 37 and the connecting block 38. As a result, the plural cassettes 2 in the stacked condition are fixed to each other by the fixing means 3 to form the cassette assembly 20 shown in FIG. 5.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A cassette assembly for storing a plurality of platelike workpieces, comprising:
   a first cassette;
   a second cassette stacked on said first cassette to form a stacked condition; and
   fixing means for fixing said first cassette and said second cassette to each other in the stacked condition of said first and second cassettes;
   each of said first and second cassettes including:
      a first side plate having a plurality of workpiece supporting grooves;
      a second side plate arranged parallel to said first side plate with a predetermined space defined therebetween, said second side plate having a plurality of workpiece supporting grooves respectively opposed to said workpiece supporting grooves of said first side plate;
      a top plate for connecting upper ends of said first and second side plates;
      a bottom plate for connecting lower ends of said first and second side plates; and
      a load/unload opening formed near front ends of said first and second side plates, said top plate, and said bottom plate for loading and unloading said workpieces;
   wherein a positioning projection is provided on the upper end of each of said first and second side plates, and a positioning recess corresponding to said positioning projection is provided on the lower end of each of said first and second side plates;
   wherein said fixing means includes:
      a catch member provided on a lower portion of the outer surface of each of said first and second side plates of said second cassette; and
      an engaging member provided on an upper portion of the outer surface of each of said first and second side plates of said first cassette for respectively engaging said catch member provided on each of said first and second side plates of said second cassette in the stacked condition of said first and second cassettes;
   each engaging member having an engaging portion for engaging the catch member and two supporting portions extending from both ends of the engaging portion, each supporting portion being bent so as to form an L shape with the engaging portion of the engaging member.

2. A cassette assembly for storing a plurality of platelike workpieces, comprising:
   a first cassette;
   a second cassette stacked on said first cassette to form a stacked condition; and
   fixing means for fixing said first cassette and said second cassette to each other in the stacked condition of said first and second cassettes;
   each of said first and second cassettes including:
      a first side plate having a plurality of workpiece supporting grooves;
      a second side plate arranged parallel to said first side plate with a predetermined space defined therebetween said second side plate having a plurality of workpiece supporting grooves respectively opposed to said workpiece supporting grooves of said first side plate;
      a top plate for connecting upper ends of said first and second side plates;
      a bottom plate for connecting lower ends of said first and second side plates; and
      a load/unload opening formed near front ends of said first and second side Plates, said top plate, and said bottom plate for loading and unloading said workpieces:
   wherein a positioning projection is provided on the upper end of each of said first and second side plates, and a positioning recess corresponding to said positioning projection is provided on the lower end of each of said first and second side plates;
   wherein said fixing means further includes:
      a female screw formed on a central portion of the outer surface of each of said first and second side plates of each cassette;
      a tightening member having a male screw for threadedly engaging said female screw; and
      first and second connecting brackets each having a plurality of cutouts for respectively receiving said male screws threadedly engaged with said female screws of said respective first and second side plates in the stacked condition of said first and second cassettes, the first and second connecting brackets being supported outside of the respective first and second side plates by first and second hook portions that respectively engage the upper end portions of the respective first and second side plates.

* * * * *